United States Patent
Nakayamada

(10) Patent No.: US 10,950,413 B2
(45) Date of Patent: Mar. 16, 2021

(54) ELECTRON BEAM IRRADIATION METHOD, ELECTRON BEAM IRRADIATION APPARATUS, AND COMPUTER READABLE NON-TRANSITORY STORAGE MEDIUM

(71) Applicant: NuFlare Technology, Inc., Yokohama (JP)

(72) Inventor: Noriaki Nakayamada, Kamakura (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/417,972

(22) Filed: May 21, 2019

(65) Prior Publication Data

US 2019/0362937 A1 Nov. 28, 2019

(30) Foreign Application Priority Data

May 22, 2018 (JP) .............................. JP2018-098298

(51) Int. Cl.
*H01J 37/317* (2006.01)
*H01J 37/304* (2006.01)
(Continued)

(52) U.S. Cl.
CPC ........ *H01J 37/3174* (2013.01); *H01J 37/244* (2013.01); *H01J 37/304* (2013.01); *H01J 37/3023* (2013.01); *H01J 2237/24564* (2013.01)

(58) Field of Classification Search
CPC .... H01J 37/30; H01J 37/3002; H01J 37/3007; H01J 37/3174
(Continued)

(56) References Cited

U.S. PATENT DOCUMENTS

| 7,652,271 B2 | 1/2010 | Wake et al. |
| 8,129,698 B2 | 3/2012 | Nakayamada et al. |

(Continued)

FOREIGN PATENT DOCUMENTS

| JP | 2011-210509 A | 10/2011 |
| JP | 5063035 | 10/2012 |

(Continued)

OTHER PUBLICATIONS

Noriaki Nakayamada, et al., "Modeling of charging effect and its correction by EB mask writer, EBM-6000", Proceedings of SPIE vol. 7028, 70280C, 2008, 12 pages.

(Continued)

*Primary Examiner* — Jason L McCormack
(74) *Attorney, Agent, or Firm* — Oblon, McClelland, Maier & Neustadt, L.L.P.

(57) ABSTRACT

An electron beam irradiation method includes calculating a charge amount distribution in the case where a substrate is irradiated with an electron beam, by using an index indicating complexity of a pattern to be formed on the substrate, calculating a positional deviation amount of an irradiation pattern to be formed due to irradiation with the electron beam, by using the charge amount distribution having been calculated, correcting an irradiation position by using the positional deviation amount having been calculated, and applying an electron beam to the irradiation position having been corrected.

10 Claims, 12 Drawing Sheets

(51) Int. Cl.
*H01J 37/302* (2006.01)
*H01J 37/244* (2006.01)

(58) Field of Classification Search
USPC .................. 250/492.22, 492.2, 492.3, 492.1
See application file for complete search history.

(56) References Cited

U.S. PATENT DOCUMENTS

| | | |
|---|---|---|
| 8,178,856 B2 | 5/2012 | Nakayamada et al. |
| 8,502,175 B2 | 8/2013 | Nakayamada et al. |
| 9,336,988 B2 | 5/2016 | Nakayamada |
| 9,355,816 B2 | 5/2016 | Ookawa et al. |
| 2007/0192757 A1 | 8/2007 | Emi et al. |
| 2011/0031387 A1* | 2/2011 | Nakayamada ...... H01J 37/3026 250/252.1 |
| 2013/0032707 A1 | 2/2013 | Nakayamada et al. |
| 2016/0027611 A1 | 1/2016 | Ookawa et al. |
| 2018/0090299 A1 | 3/2018 | Nakayamada |

FOREIGN PATENT DOCUMENTS

| | | |
|---|---|---|
| JP | 5414103 | 2/2014 |
| JP | 5480496 | 4/2014 |
| JP | 5480555 | 4/2014 |
| JP | 5525798 | 6/2014 |
| JP | 5525936 | 6/2014 |
| JP | 5617947 | 11/2014 |
| JP | 5667848 | 2/2015 |
| JP | 6353229 | 7/2018 |
| JP | 2018-133552 | 8/2018 |
| KR | 10-2018-0035178 A | 4/2018 |

OTHER PUBLICATIONS

Noriaki Nakayamada, et al., "Advancing the Charging Effect Correction with Time-Dependent Discharging Model", Proceedings of SPIE vol. 8081-40, 2011, 9 pages.

Noriaki Nakayamada, et al., "Modeling of Resist Surface Charging Effect on EBM-8000 and its Comparison with EBM-6000", Proceedings of SPIE vol. 8701-34, 2013, 8 pages.

Noriaki Nakayamada, et al., "Characterization of Decay Component of Resist Surface Charging on EBM-8000", Proceedings of SPIE vol. 9256-41, 2014, 8 pages.

Noriaki Nakayamada, et al., "Electron beam lithographic modeling assisted by artificial intelligence technology", Proceedings of SPIE vol. 10454, 104540B, 2017, 8 pages.

Sergey Babin, et al., "Placement error due to charging in EBL: experimental verification of a new correction model", Proceedings of SPIE vol. 8441, 844112, 2012, 8 pages.

Jin Choi, et al., "Image placement error of photomask due to pattern loading effect: analysis and correction technique for sub-45 nm node", Proceedings of SPIE vol. 7028, 70281X, 2008, 13 pages.

Timo Wandel et al., "The trouble starts with using electrons—Putting charging effect correction models to the test", Proceedings of SPIE vol. 8166, 81661C, 2011, 10 pages.

Taiwanese Office Action dated Mar. 23, 2020, in Patent Application No. 108116501, 12 pages (with unedited computer generated English translation).

Office Action dated Jul. 10, 2020 in corresponding Korean Patent Application No. 10-2019-0059459 (with English Translation), 8 pages.

Office Action dated Nov. 12, 2020, in Taiwanese Patent Application No. 108116501 w/ English Machine Translation.

* cited by examiner

U = 25%
Maximum Shot Size 0.25
Simple Pattern

U = 25%
Maximum Shot Size 0.25
Complex Pattern

U = 25%
Maximum Shot Size 0.1
Simple Pattern

U = 25%
Maximum Shot Size 0.25
Simple Pattern

U = 25%
Maximum Shot Size 0.25
Complex Pattern

U = 25%
Maximum Shot Size 0.1
Simple Pattern

FIG.6

ELECTRON BEAM IRRADIATION METHOD, ELECTRON BEAM IRRADIATION APPARATUS, AND COMPUTER READABLE NON-TRANSITORY STORAGE MEDIUM

CROSS-REFERENCE TO RELATED APPLICATION

This application is based upon and claims the benefit of priority from prior Japanese Patent Application No. 2018-098298 filed on May 22, 2018 in Japan, the entire contents of which are incorporated herein by reference.

BACKGROUND OF THE INVENTION

Field of the Invention

Embodiments of the present invention relate to an electron beam irradiation method, an electron beam irradiation apparatus, and a program, and, for example, relate to a writing apparatus and method for writing a pattern with electron beams, on a target object.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 13 is a conceptual diagram explaining operations of a variable-shaped electron beam writing or "drawing" apparatus. The variable-shaped electron beam writing apparatus operates as described below. A first aperture plate 410 has a rectangular aperture 411 for shaping an electron beam 330. A second aperture plate 420 has a variable shape aperture 421 for shaping the electron beam 330 having passed through the aperture 411 of the first aperture plate 410 into a desired rectangular shape. The electron beam 330 emitted from a charged particle source 430 and having passed through the aperture 411 of the first aperture plate 410 is deflected by a deflector so as to pass through a part of the variable shape aperture 421 of the second aperture plate 420, and thereby to irradiate a target object or "sample" 340 placed on a stage which continuously moves in one predetermined direction (e.g., x direction). In other words, a rectangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) method.

When a target object such as a mask is irradiated with electron beams, the irradiated position and its peripheral region may have been charged with the electron beams previously irradiated. Conventionally, as a method for correcting such deviation of the position irradiated by the beams, there has been known to form a charge dissipation layer (CDL) on the substrate in order to prevent charging of the substrate surface. However, since the charge dissipation layer basically has acidic properties, it has a poor affinity in the case of the substrate applied with chemically amplified resist, for example. Further, there is a need to provide new equipment in order to form the charge dissipation layer, thereby increasing the manufacturing cost of a photomask. For this reason, it is desired to perform charging effect correction (CEC) without using a charge dissipation layer. Positional deviation of the irradiation position due to a charging phenomenon is not limited to the electron beam writing apparatus. It may similarly occur in the charged particle beam irradiation apparatus, which uses a result obtained by applying a charged particle beam to an aimed position, such as an inspection apparatus for inspecting a pattern with charged particle beams such as electron beams.

Then, with respect to positional deviation due to the charging phenomenon, the applicant proposed a writing apparatus using a charging effect correction method which calculates the amount of correction of a beam irradiation position by obtaining a charge distribution, and applies a beam to the position corrected based on the correction amount (e.g., refer to Japanese Patent Publications (JP-A) No. 2012-15246, and No. 2015-138882. However, while a higher dimensional accuracy is required in accordance with the recent miniaturization, a problem has occurred that the charging effect correction may not perform correction sufficiently.

BRIEF SUMMARY OF THE INVENTION

According to one aspect of the present invention, an electron beam irradiation method includes calculating a charge amount distribution in a case where a substrate is irradiated with an electron beam, by using an index indicating complexity of a pattern to be formed on the substrate; calculating a positional deviation amount of an irradiation pattern to be formed due to irradiation with the electron beam, by using the charge amount distribution having been calculated; correcting an irradiation position by using the positional deviation amount having been calculated; and applying an electron beam to the irradiation position having been corrected.

According to another aspect of the present invention, an electron beam irradiation apparatus includes a charge amount distribution calculation circuit programmed to calculate a charge amount distribution in a case where a substrate is irradiated with an electron beam, by using an index indicating complexity of a pattern to be formed on the substrate; a positional deviation amount calculation circuit programmed to calculate a positional deviation amount of an irradiation pattern to be formed due to irradiation by the electron beam, by using the charge amount distribution having been calculated; a correction circuit programmed to correct an irradiation position by using the positional deviation amount having been calculated; and an electron beam irradiation mechanism including an emission source which emits the electron beam and a deflector which deflects the electron beam to apply an electron beam to the irradiation position having been corrected.

According to yet another aspect of the present invention, a non-transitory computer readable storage medium storing a program for causing a computer, which controls an electron beam irradiation apparatus for applying an electron beam, to execute processing includes calculating a charge amount distribution in a case where a substrate is irradiated with an electron beam, by using an index, which indicates complexity of a pattern to be formed on the substrate, read from a storage device; and calculating a positional deviation amount of an irradiation pattern to be formed due to irradiation by the electron beam, by using the charge amount distribution having been calculated.

BRIEF DESCRIPTION OF THE DRAWINGS

FIG. 6 shows an example of layout of an evaluation pattern written on an evaluation substrate according to the first embodiment;

DETAILED DESCRIPTION OF THE INVENTION

A first embodiment describes a method and apparatus which can improve the accuracy of charging effect correction when electron beams are applied as compared to the conventional one.

First Embodiment

Figure 1:
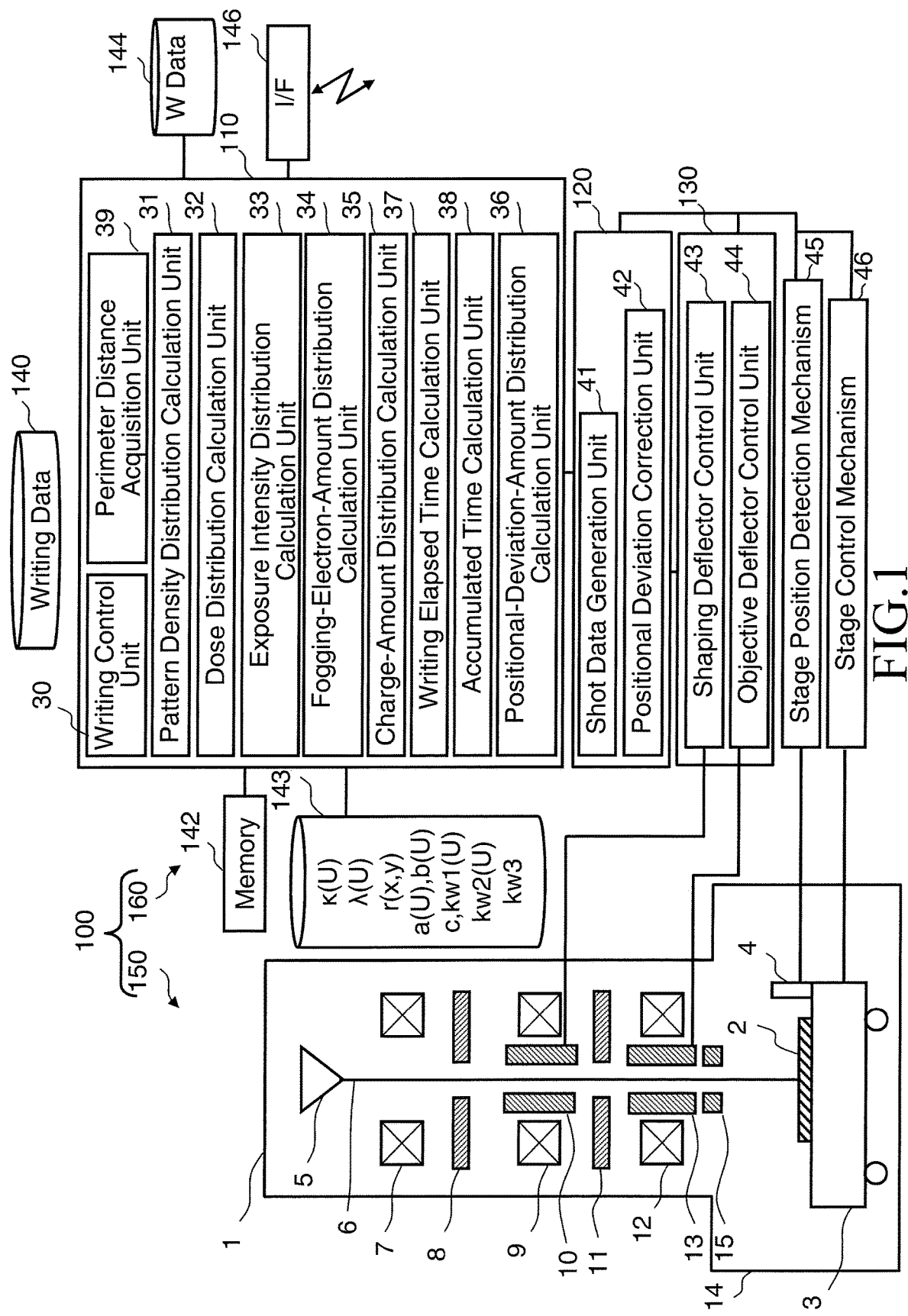
FIG. 1 is a conceptual diagram showing an example of the main structure of a writing apparatus according to a first embodiment.

FIG. 1 is a conceptual diagram showing an example of the main structure of a writing apparatus according to a first embodiment. In FIG. 1, a writing apparatus 100 includes a writing mechanism 150 and a control circuit 160. The writing apparatus 100 is an example of an electron beam writing apparatus. The writing mechanism 150 includes an electron optical column 1 and a writing chamber 14. In the electron optical column 1, there are disposed an electron gun 5, an illumination lens 7, a first shaping aperture substrate 8, a projection lens 9, a deflector 10, a second shaping aperture substrate 11, an objective lens 12, a deflector 13, and an electrostatic lens 15. In the writing chamber 14, there is disposed an XY stage 3, on which a target object 2 to be written is placed. The target object 2 is, for example, a photomask used for exposure in semiconductor manufacturing and a wafer for forming a semiconductor device. The photomask to be written may be a mask blank where no patterns are formed. It should be understood that a resist film being photosensitive to an electron beam has been formed on the target object when patterns are written. On the XY stage 3, a mirror 4 for measuring the stage position is disposed at a position different from that where the target object 2 is placed.

The control circuit 160 includes control computers 110 and 120, a stage position detection mechanism 45, a stage control mechanism 46, a deflection control circuit 130, a memory 142, storage devices 140, 143, and 144 such as magnetic disk devices, and an external interface (I/F) circuit 146. The control computers 110 and 120, the stage position detection mechanism 45, the stage control mechanism 46, the deflection control circuit 130, the memory 142, the storage devices 140, 143, and 144, and the external I/F circuit 146 are connected with each other by a bus (not shown). The deflection control circuit 130 is connected to the deflectors 10 and 13.

In the control computer 110, there are provided functions, such as a writing control unit 30, a pattern density distribution calculation unit 31, a dose distribution calculation unit 32, an exposure intensity distribution calculation unit 33, a fogging-electron-amount distribution calculation unit 34, a charge-amount distribution calculation unit 35, a writing elapsed time calculation unit 37, an accumulated time calculation unit 38, a positional-deviation-amount distribution calculation unit 36, and a perimeter distance acquisition unit 39. Each of the "units" such as the writing control unit 30, the pattern density distribution calculation unit 31, the dose distribution calculation unit 32, the exposure intensity distribution calculation unit 33, the fogging-electron-amount distribution calculation unit 34, the charge-amount distribution calculation unit 35, the writing elapsed time calculation unit 37, the accumulated time calculation unit 38, the positional-deviation-amount distribution calculation unit 36, and the perimeter distance acquisition unit 39 includes processing circuitry. As the processing circuitry, for example, an electric circuit, computer, processor, circuit board, quantum circuit, semiconductor device, or the like can be used. Each of the "units" may use common processing circuitry (same processing circuitry), or different processing circuitry (separate processing circuitry). Input data required in the writing control unit 30, the pattern density distribution calculation unit 31, the dose distribution calculation unit 32, the exposure intensity distribution calculation unit 33, the fogging-electron-amount distribution calculation unit 34, the charge-amount distribution calculation unit 35, the writing elapsed time calculation unit 37, the accumulated time calculation unit 38, the positional-deviation-amount distribution calculation unit 36, and the perimeter distance acquisition unit 39, and calculated results are stored in the memory 142 each time.

In the control computer 120, there are provided functions, such as a shot data generation unit 41 and a positional deviation correction unit 42. Each of the "units" such as the shot data generation unit 41 and the positional deviation correction unit 42 includes processing circuitry. As the processing circuitry, for example, an electric circuit, computer, processor, circuit board, quantum circuit, semiconductor device, or the like can be used. Each of the "units" may use common processing circuitry (same processing circuitry), or different processing circuitry (separate processing circuitry). Input data required in the shot data generation unit 41 and the positional deviation correction unit 42, and calculated results are stored in a memory (not shown) each time.

In the deflection control circuit 130, there are provided functions, such as a shaping deflector control unit 43 and an objective deflector control unit 44. Each of the "units" such as the shaping deflector control unit 43 and the objective deflector control unit 44 includes processing circuitry. As the processing circuitry, for example, an electric circuit, computer, processor, circuit board, quantum circuit, semiconductor device, or the like can be used. Each of the "units" may use common processing circuitry (same processing circuitry), or different processing circuitry (separate processing circuitry). Input data required in the shaping deflector control unit 43 and the objective deflector control unit 44, and calculated results are stored in a memory (not shown) each time.

Moreover, writing data (layout data) defining a plurality of figure patterns to be written is input from the outside of the writing apparatus 100, and stored in the storage device 140.

While only the structure elements necessary for explaining the first embodiment are shown in FIG. 1, it should be understood that other structure elements generally necessary for the writing apparatus 100 may also be included.

An electron beam 6 emitted from the electron gun 5 irradiates the entire first shaping aperture substrate 8, having a rectangular (including square) opening, by the illumination lens 7. At this point, the electron beam 6 is first shaped to a rectangle. Then, after having passed through the first shaping aperture substrate 8, the electron beam 6 of a first aperture image is projected onto the second shaping aperture substrate 11 by the projection lens 9. The position of the first aperture image on the second shaping aperture substrate 11 is deflection-controlled by the deflector 10, which is controlled by the shaping deflector control unit 43, so as to change (variably shape) the shape and size of the beam. Then, after having passed through the second shaping aperture substrate 11, the electron beam 6 of a second aperture image is focused by the objective lens 12 and deflected by the deflector 13 which is, for example, an electrostatic deflector controlled by the objective deflector control unit 44, to reach a desired position on the target object 2 placed on the XY stage 3 movably arranged. The XY stage 3 is driven and controlled by the stage control mechanism 46. The position of the XY stage 3 is detected by the stage position detection mechanism 45. The stage position detection mechanism 45 includes, for example, a laser length measuring device which applies a laser to the mirror 4 and measures a position based on interference between incident light and reflected light. The electrostatic lens 15 dynamically corrects the focus position of the electron beam 6, based on topological non-flatness of the surface of the target object 2 (dynamic focus).

Figure 2:
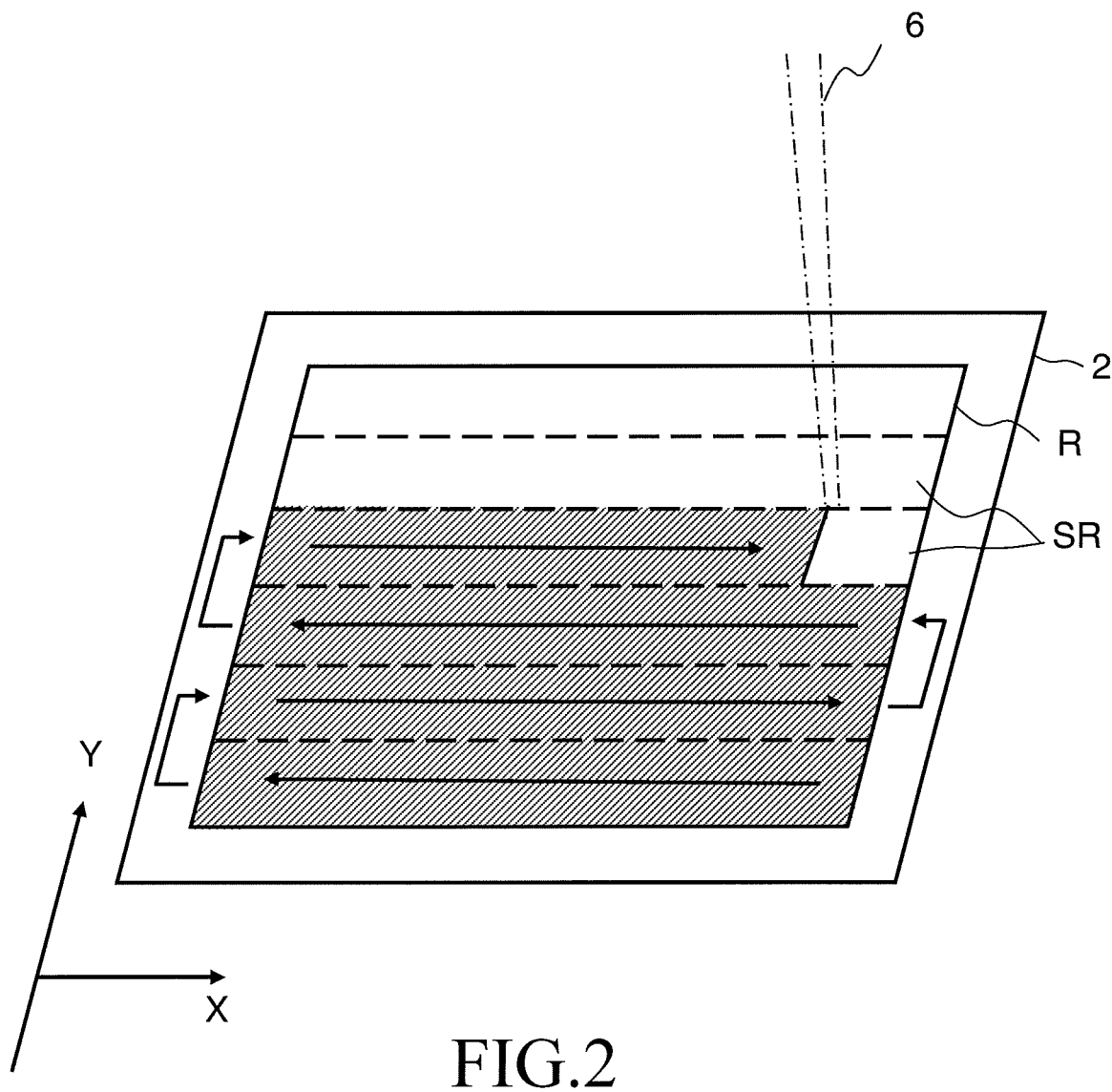
FIG. 2 illustrates a state of a stage movement described in the first embodiment.

FIG. 2 illustrates a state of a stage movement described in the first embodiment. When writing on the target object 2, the electron beam 6 irradiates one stripe region of the target object 2, which is obtained by virtually dividing a writing region (R) on the writing (exposure) surface into a plurality of stripe regions (SR) in a strip form and to which the electron beam 6 can be deflected, while the XY stage 3 is continuously moving, for example, in the x direction. The movement of the XY stage 3 in the x direction is a continuous movement, for example, and simultaneously, the shot position of the electron beam 6 is made to follow the movement of the stage. Writing time can be shortened by performing the continuous movement. After writing one stripe region, the XY stage 3 is moved in the y direction by a step feed. Then, the writing operation of the next stripe region is performed in the X direction (reverse direction). By performing the writing operation of each stripe region in a zigzag manner, the movement time of the XY stage 3 can be shortened. Moreover, in the writing apparatus 100, when processing layout data (writing data), the writing region is virtually divided into a plurality of frame regions in a strip form, and data processing is performed for each frame region. For example, when not performing multiple exposures, the frame region and the stripe region mentioned above are usually the same region. When performing multiple exposures, the frame region and the stripe region become different from each other according to multiplicity. Alternatively, the writing region is virtually divided into a plurality of frame regions which are the same regions as the stripe regions according to the multiplicity, and data processing is performed for each frame region. Thus, the writing region of the target object 2 is virtually divided into frame regions (stripe regions) serving as a plurality of writing unit regions, and the writing mechanism 150 writes each frame region (stripe region).

Figure 3A:
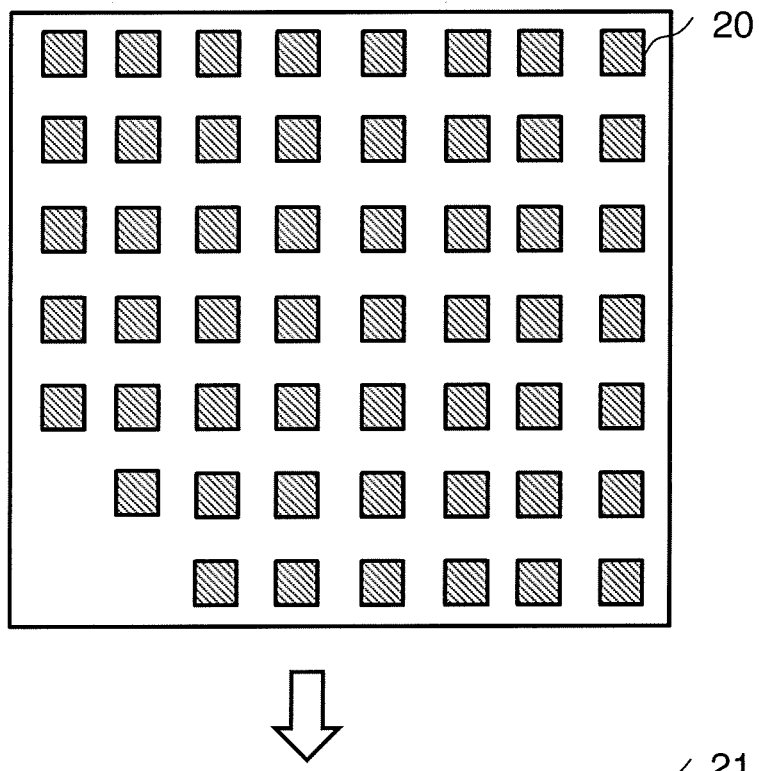
FIG. 3A shows an example of a pattern region of an evaluation substrate according to a comparative example of the first embodiment.
Figure 3B:
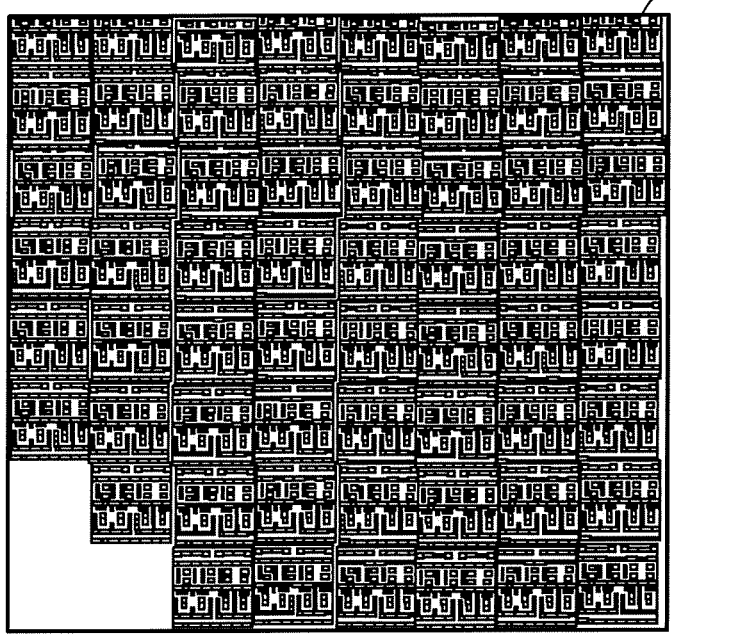
FIG. 3B shows an example of an actual pattern region of a substrate used for products according to the comparative example of the first embodiment.

FIG. 3A shows an example of a pattern region of an evaluation substrate according to a comparative example of the first embodiment, and FIG. 3B shows an example of an actual pattern region of a substrate used for products according to the comparative example of the first embodiment. In FIG. 3A being an example of a pattern region of an evaluation substrate according to the comparative example, a plurality of evaluation patterns 20 are arranged in the pattern region of the evaluation substrate. In each evaluation pattern 20, a simple pattern whose pattern density is different from that of other simple pattern is arranged. For example, a contact hole pattern (rectangular, including square, pattern) is arranged with changing its size depending on the pattern density. On the other hand, as described above, FIG. 3B shows an example of an actual pattern region of the substrate used for products according to the comparative example. In the actual pattern region of the product substrate, not a simple pattern like the evaluation pattern 20 but an actual pattern 21 of a complex circuit layout is arranged. When actually writing the evaluation pattern 20 and the actual pattern 21 by using a conventional correction method for the charge amount, it turned out that a difference occurs between the positional deviation amounts of both patterns. Evaluation of the evaluation pattern 20 and the actual pattern 21 is performed assuming that a difference between the patterns 20 and 21 with respect to the charge amount is due to complexity of patterns.

Figure 4A:
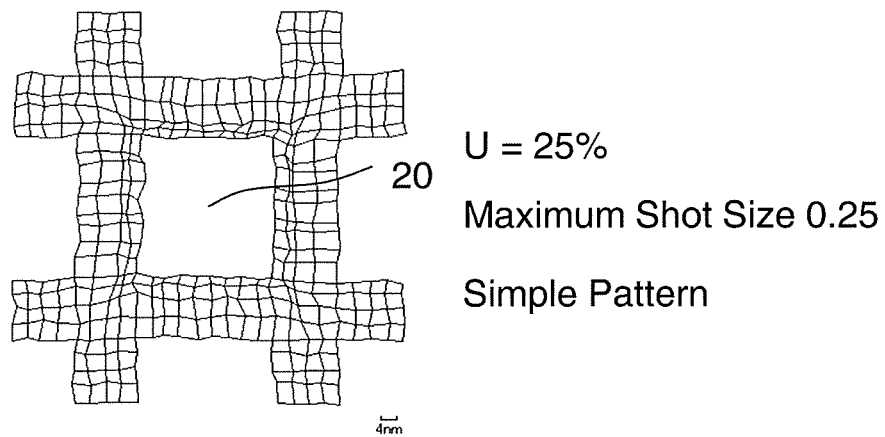
FIGS. 4A to 4C show examples of a positional deviation amount resulting from charging of an evaluation pattern, and examples of an amount of positional deviation resulting from charging of a mock product pattern which is tentatively regarded as an actual pattern on a product substrate, according to a comparative example of the first embodiment.
Figure 4B:
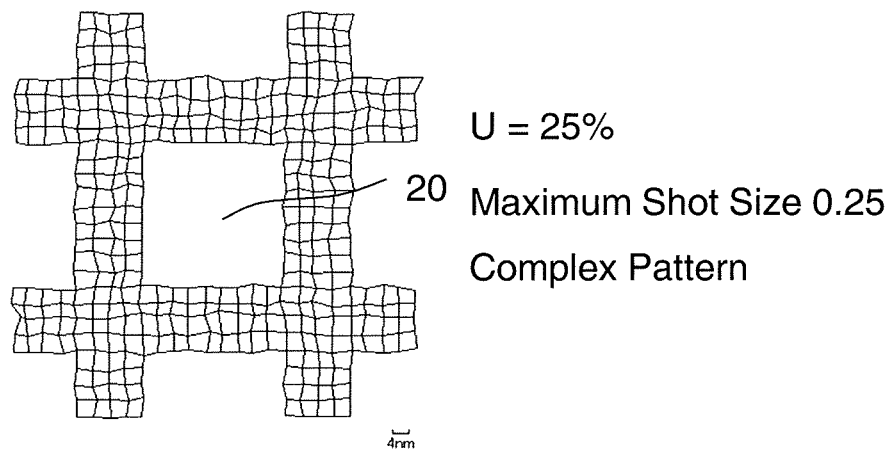
Figure 4C:
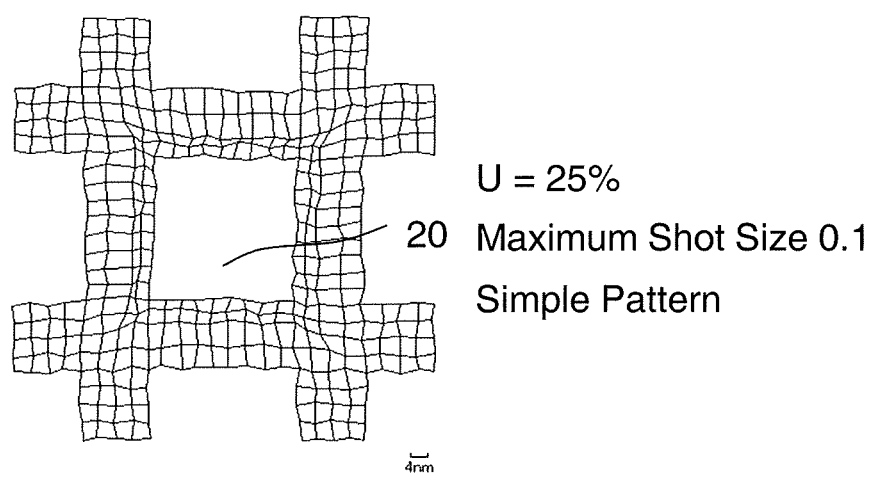

FIGS. 4A to 4C show examples of a charge amount of an evaluation pattern, and examples of an amount of positional deviation resulting from charging of a mock product pattern which is tentatively regarded as an actual pattern on a product substrate, according to a comparative example of the first embodiment.

Figure 5A:
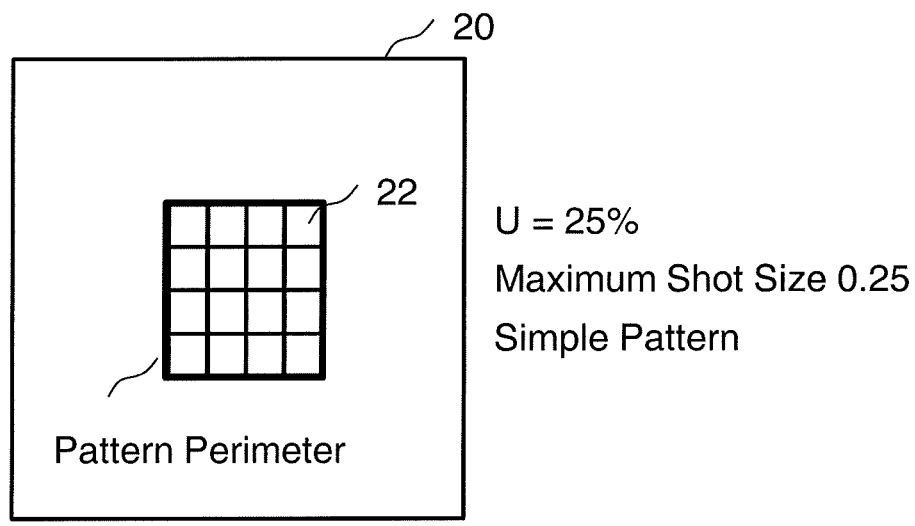
FIGS. 5A to 5C show examples of an evaluation pattern, and examples of a mock product pattern which is tentatively regarded as an actual pattern on a product substrate, according to a comparative example of the first embodiment.
Figure 5B:
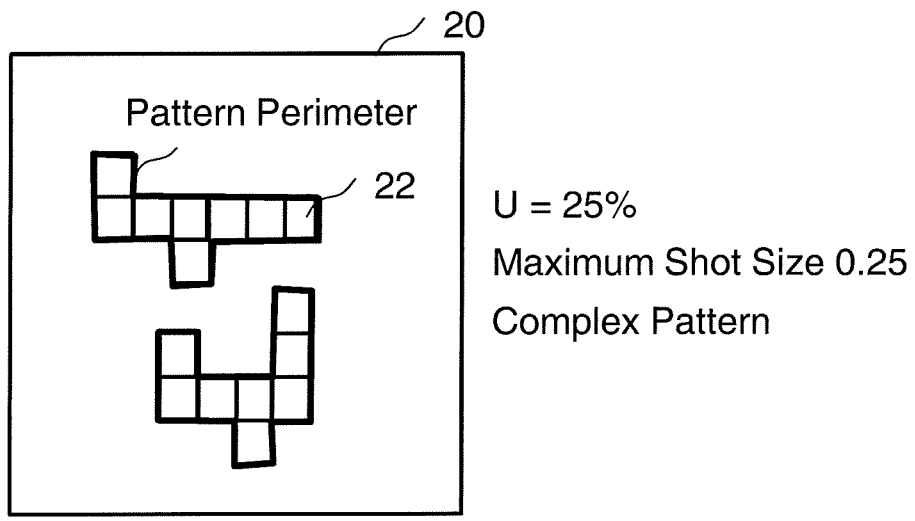
Figure 5C:
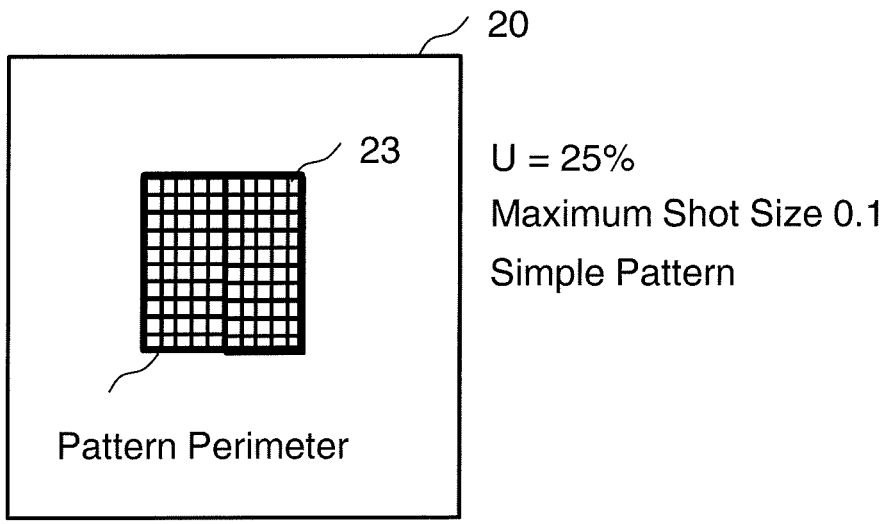

FIGS. 5A to 5C show examples of an evaluation pattern, and examples of a mock product pattern which is tentatively regarded as an actual pattern on a product substrate, according to a comparative example of the first embodiment. FIG. 5A shows, as the evaluation pattern 20, a simple pattern having a pattern density U of 25% which is a rectangular (including square) pattern written by connecting shot figures 22 each having the maximum shot size of 0.25 µm. FIG. 4A shows an example of an amount of positional deviation resulting from charging of the evaluation pattern 20 and its periphery when a simple pattern having a pattern density U of 25% is written as the evaluation pattern 20 by connecting shot figures each having the maximum shot size of 0.25 µm in a rectangular shape. On the other hand, FIG. 5B shows, as the evaluation pattern 20, a mock product pattern which is a substitute for an actual pattern, the mock product pattern having a pattern density U of 25% and written by connecting the shot figures in a shape more complex than the rectangular pattern which is the simple pattern having a pattern density U of 25% written by connecting the shot figures each having the maximum shot size of 0.25 µm. FIG. 4B shows an example of an amount of positional deviation resulting from charging of the actual pattern 21 substituted with a mock product pattern and its periphery when the mock product pattern (complex pattern) having a pattern density U of 25% and being a substitute for an actual pattern is written as the evaluation pattern 20 by connecting shot figures each having the maximum shot size of 0.25 µm in a complex shape. In the examples of FIGS. 4A and 4B, since both patterns are written at the pattern density U of 25%, it may be thought that the charge amounts occurred in both the patterns are the same, but, however, it has turned out that there is a difference between the charge amount distributions as shown in FIGS. 4A and 4B. Then, with respect to this difference, influence of the shot size has been examined. FIG. 5C shows, as the evaluation pattern 20, a simple pattern having a pattern density U of 25% which is a rectangular pattern written by connecting shot figures each having the maximum shot size of 0.1 µm. FIG. 4C shows a charging result of writing while changing the shot size. FIG. 4C shows an example of an amount of positional deviation resulting from charging of the evaluation pattern 20 and its periphery when a simple pattern having a pattern density U of 25% is written as the evaluation pattern 20 by connecting shot figures each having the maximum shot size of 0.1 µm in a rectangular shape. However, as shown in FIGS. 4A and 4C, there is no substantial difference between the charge amount distributions. Therefore, from this point, it has found that the difference of the amounts of positional deviation with respect to the charge amount is resulting from complexity of patterns.

Figure 6:
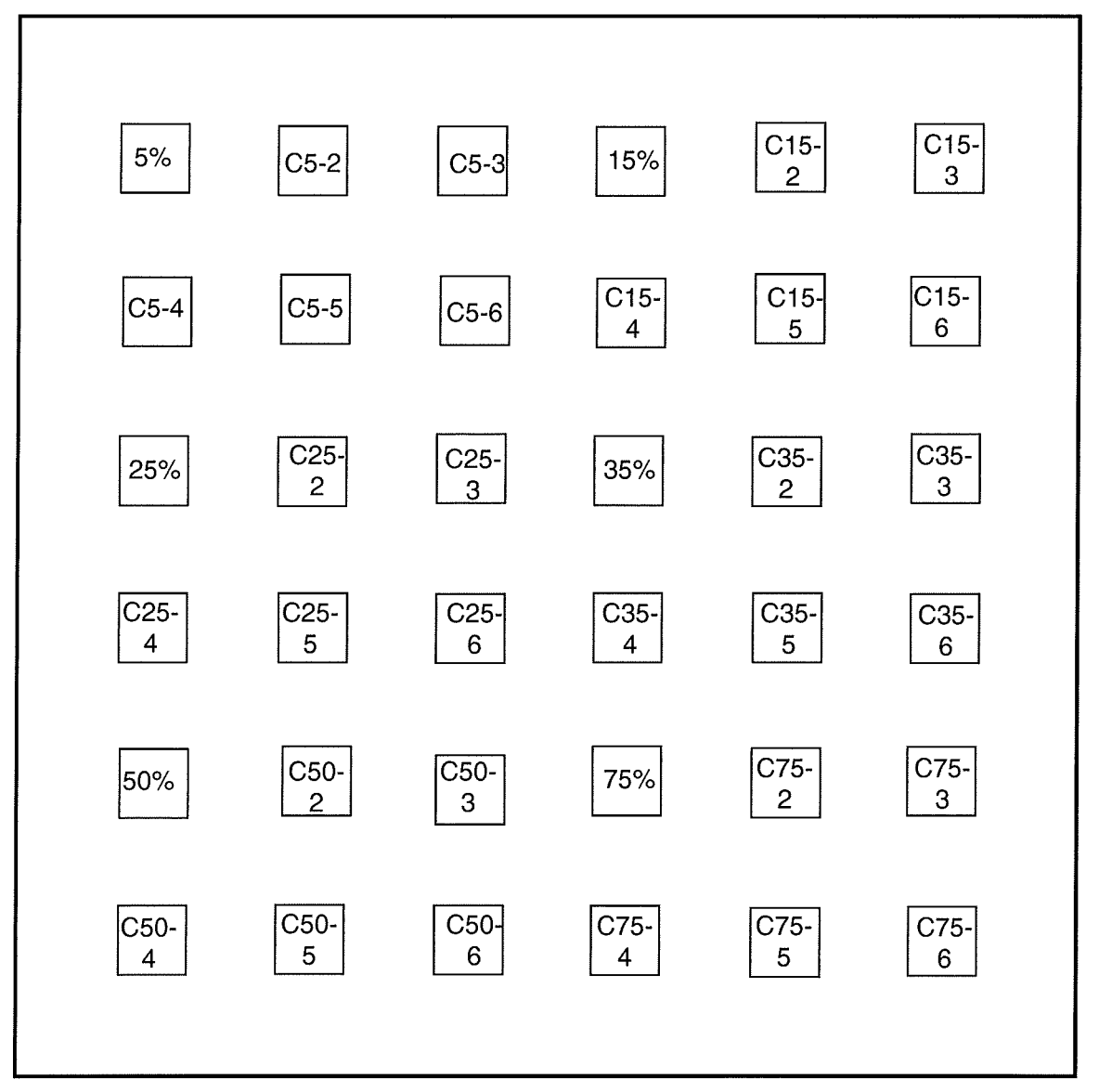

FIG. 6 shows an example of layout of an evaluation pattern written on an evaluation substrate according to the first embodiment. In FIG. 6, a plurality of evaluation patterns, whose pattern density and pattern complexity are variable, are arranged on the evaluation substrate. In the first embodiment, the perimeter distance W of the pattern per unit area is used as an index indicating pattern complexity. When a plurality of patterns are arranged in the unit area, W being the total of perimeter distances of the patterns per unit area is used. Then, in the example of FIG. 6, a plurality of pattern layouts are configured such that the perimeter distance W of the pattern per unit area is variable with respect to a plurality of pattern densities U.

In the example of FIG. 6, with respect to pattern density 5%, there are arranged a simple rectangular pattern (5%), a line and space pattern (C5-2) of line width 0.4 µm, a contact hole pattern (C5-3) of size 0.45 µm, a contact hole pattern (C5-4) of size 0.25 µm, a line and space pattern (C5-5) of line width 0.1 µm, and a contact hole pattern (C5-6) of size 0.1 µm.

Similarly, with respect to pattern density 15%, there are arranged a simple rectangular pattern (15%), a line and space pattern (C15-2) of line width 0.4 µm, a contact hole pattern (C15-3) of size 0.45 µm, a contact hole pattern (C15-4) of size 0.25 µm, a line and space pattern (C15-5) of line width 0.1 µm, and a contact hole pattern (C15-6) of size 0.1 µm.

Similarly, with respect to pattern density 25%, there are arranged a simple rectangular pattern (25%), a line and space pattern (C25-2) of line width 0.4 µm, a contact hole pattern (C25-3) of size 0.45 µm, a contact hole pattern (C25-4) of size 0.25 µm, a line and space pattern (C25-5) of line width 0.1 µm, and a contact hole pattern (C25-6) of size 0.1 µm.

Similarly, with respect to pattern density 35%, there are arranged a simple rectangular pattern (35%), a line and space pattern (C35-2) of line width 0.4 µm, a contact hole pattern (C35-3) of size 0.45 µm, a contact hole pattern (C35-4) of size 0.25 µm, a line and space pattern (C35-5) of line width 0.1 µm, and a contact hole pattern (C35-6) of size 0.1 µm.

Similarly, with respect to pattern density 50%, there are arranged a simple rectangular pattern (50%), a line and space pattern (C50-2) of line width 0.4 µm, a contact hole pattern (C50-3) of size 0.45 µm, a contact hole pattern (C50-4) of size 0.25 µm, a line and space pattern (C50-5) of line width 0.1 µm, and a contact hole pattern (C50-6) of size 0.1 µm.

Similarly, with respect to pattern density 75%, there are arranged a simple rectangular pattern (75%), a line and space pattern (C75-2) of line width 0.4 µm, a contact hole pattern (C75-3) of size 0.45 µm, a contact hole pattern (C75-4) of size 0.25 µm, a line and space pattern (C75-5) of line width 0.1 µm, and a contact hole pattern (C75-6) of size 0.1 µm.

Figure 7:
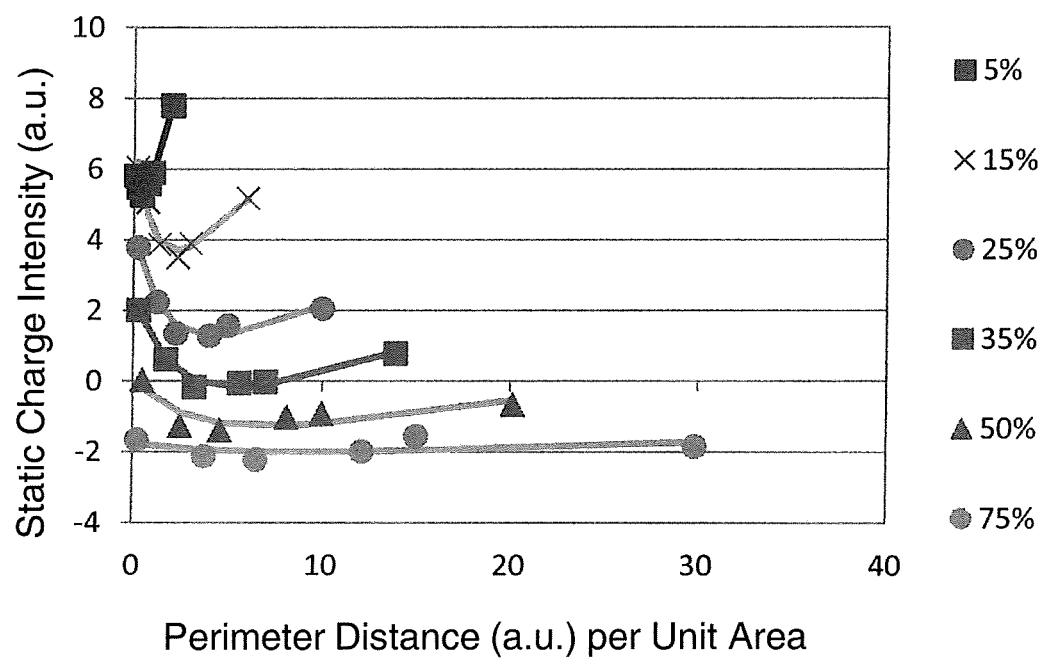
FIG. 7 shows a measurement result of the amount of charge due to pattern complexity according to the first embodiment.

FIG. 7 shows a measurement result of the amount of charge due to pattern complexity according to the first embodiment. In FIG. 7, the ordinate axis represents a static charge amount (its unit is arbitrary) and the abscissa axis represents a perimeter distance W (its unit is arbitrary) per unit area. FIG. 7 shows a measurement result of the charge amount in the case where an evaluation pattern is written on the evaluation substrate shown in FIG. 6. As shown in FIG. 7, as the perimeter distance W per unit area becomes even larger, the charge amount once decreases (positive charge decreases) with respect to any pattern density U, and, further, it turns out that when the perimeter distance W per unit area becomes larger, the charge amount has a tendency to slowly increase. If fitting the result of FIG. 7 by a polynomial, a charge amount Cw due to pattern complexity can be approximated by the following equation (1).

$$Cw(U,W) = a(U) \cdot W/U + b(U)\{1 - \exp(-c \cdot W/U)\} \quad (1)$$

In the equation, the function $a(U)$ represents a function depending on a pattern density U. The function $b(U)$ represents a function depending on the pattern density U and being different from the function $a(U)$. "c" represents a coefficient. Thus, the charge amount Cw due to complexity of a pattern can be calculated by applying the model equation (1) which uses an area density U of a pattern, a perimeter distance W of the pattern per unit area, a function $a(U)$ depending on the area density U of the pattern, a function $b(U)$ depending on the area density U and being different from the function $a(U)$, and a coefficient "c".

The amount of charge occurred on the target object 2 can be resolved (separated) into a variable $C_E(E)$ contributed by an irradiation electron, a variable $C_F(F)$ contributed by a fogging electron, and a charge decay component $C_T(T,t)$ contributed by an elapsed time, in addition to the charge amount Cw due to pattern complexity. Among them, the component resulting from pattern complexity is verified with respect to the charge decay component $C_T$.

Figure 8:
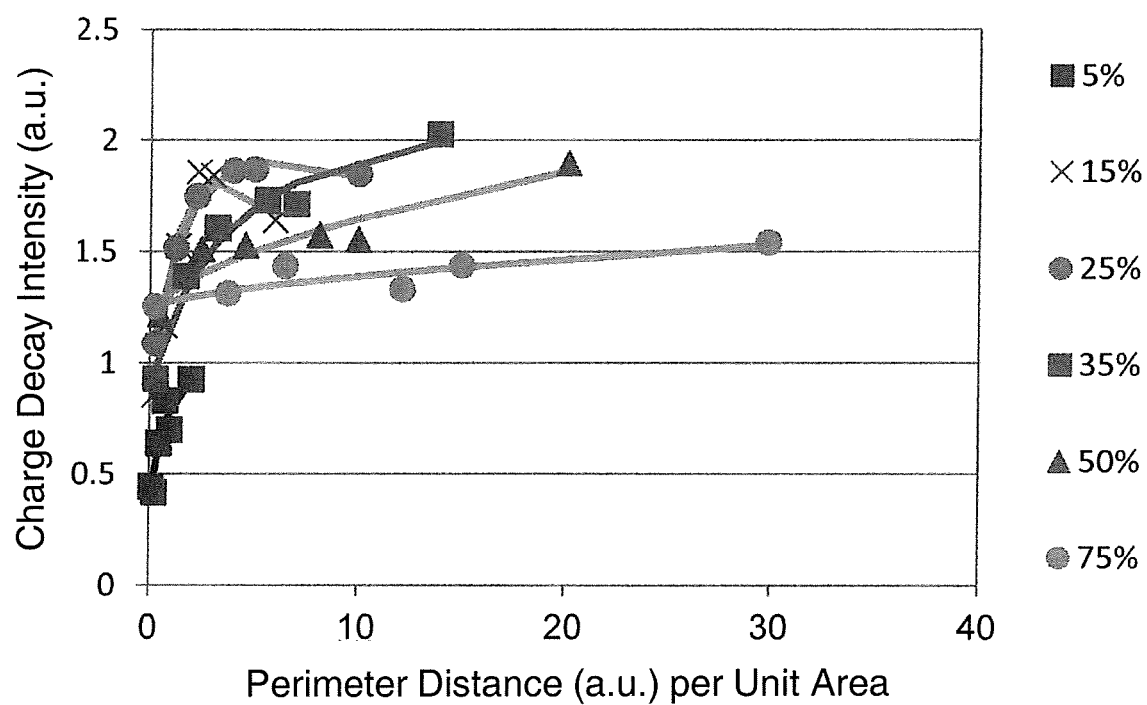
FIG. 8 shows a measurement result of the intensity of charge decay due to pattern complexity according to the first embodiment.

FIG. 8 shows a measurement result of the intensity of charge decay (attenuation) due to pattern complexity according to the first embodiment. In FIG. 8, the ordinate axis represents a charge decay intensity (its unit is a.u.) and the abscissa axis represents a perimeter distance W (its unit is a.u.) per unit area. FIG. 8 shows a measurement result of the charge decay intensity in the case where an evaluation pattern is written on the evaluation substrate shown in FIG. 6. As shown in FIG. 8, it turns out that, with respect to any pattern density U, as the perimeter distance W per unit area becomes larger, the charge decay intensity has a tendency to increase (decay progresses) so as to converge (saturate). If fitting the result of FIG. 8 by a polynomial, a charge decay intensity kw due to pattern complexity can be approximated by the following equation (2).

$$kw=kw1(U)\cdot W/U+kw2(U)\cdot\{1-\exp(-kw3\cdot W/U)\} \quad (2)$$

In the equation, the function kw1(U) represents a function depending on a pattern density U. The function kw2(U) represents a function depending on the pattern density U and being different from the function kw1(U). kw3 represents a coefficient. Thus, the charge decay intensity kw(U,W) due to complexity of a pattern can be calculated by using the model equation (2) which uses an area density U of a pattern, a perimeter distance W of the pattern per unit area, a function kw1(U) depending on the area density U of the pattern, a function kw2(U) depending on the area density U and being different from the function kw1(U), and a coefficient kw3.

The equation (2) can be the same as the model equation (1) described above by replacing a(U) with the function kw1(U), b(U) with the function kw2(U), and the coefficient "c" with the coefficient kw3. In other words, the amount of charge due to pattern complexity and the charge decay intensity due to pattern complexity can be expressed by the same model equation (1). In light of what is described above, in the first embodiment, a charge-amount distribution C is obtained in consideration of the amount of charge due to pattern complexity. Similarly, in the first embodiment, the charge-amount distribution C is obtained in consideration of the intensity of charge decay due to pattern complexity.

Figure 9:
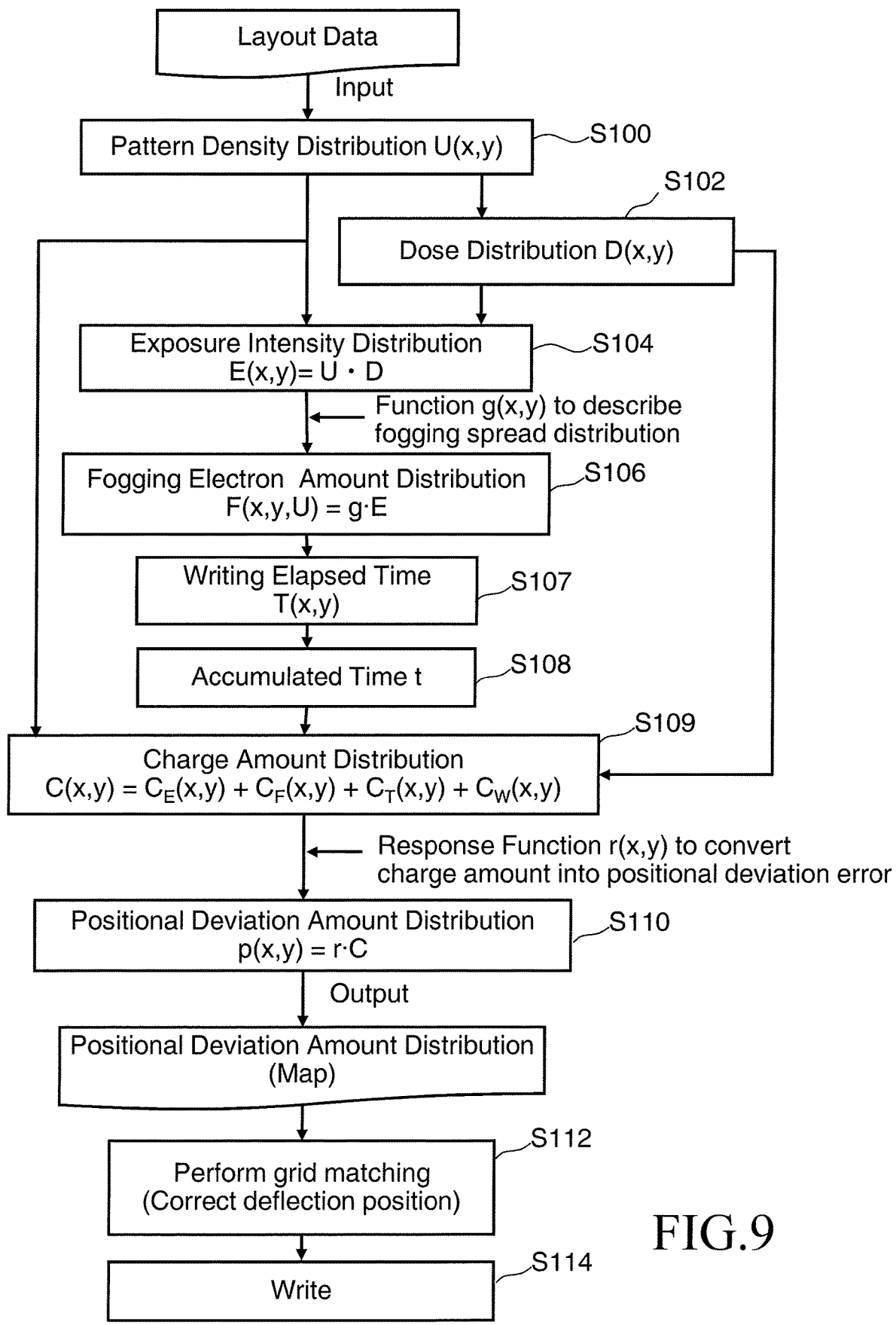
FIG. 9 is a flowchart showing an example of main steps of a writing method according to the first embodiment.

FIG. 9 is a flowchart showing an example of main steps of a writing method according to the first embodiment. In FIG. 9, the writing method of the first embodiment executes a series of steps: a pattern-area-density distribution U(x,y) calculating step (S100), a dose distribution D(x,y) calculating step (S102), an exposure intensity distribution E(x,y) calculating step (S104), a fogging-electron-amount distribution F(x,y,U) calculating step (S106), a writing elapsed time T(x,y) calculating step (S107), an accumulated time "t" calculating step (S108), a charge-amount distribution C(x,y) calculating step (S109), a positional-deviation-amount distribution p(x,y) calculating step (S110), a deflection position correcting step (S112), and a writing step (S114).

In the pattern-area-density distribution U(x,y) calculating step (S100), the pattern density distribution calculation unit 31 reads writing data from the storage device 140, and calculates a pattern density U(x,y) indicating a coverage rate of a figure pattern defined in the writing data, for each mesh region obtained by virtually dividing the writing region (or frame region) into a plurality of mesh regions in a mesh form by a prescribed dimension (grid dimension). Then, a distribution U(x,y) of pattern density for each mesh region is generated.

In the dose distribution D(x,y) calculating step (S102), the dose distribution calculation unit 32 calculates a distribution D(x,y) of the dose for each mesh region, using a pattern density distribution U(x,y). In calculating the dose, it is preferable to perform correction of a proximity effect due to backscattered electrons. The dose D can be defined by the following equation (3).

$$D=D_0\times\{(1+2\times\eta)/(1+2\times\eta\times U)\} \quad (3)$$

In the equation (3), $D_0$ indicates a reference dose, and $\eta$ indicates a backscattering ratio.

The reference dose $D_0$ and the backscattering ratio $\eta$ are set by the user of the writing apparatus 100 concerned. The backscattering ratio $\eta$ can be set in consideration of the acceleration voltage of the electron beam 6, the resist thickness and ground substrate type of the target object 2, the process conditions (e.g., PEB conditions and developing conditions) and the like.

In the exposure intensity distribution E(x,y) calculating step (S104), the exposure intensity distribution calculation unit 33 calculates an exposure intensity distribution E(x,y) (also called an "irradiation intensity distribution") for each mesh region by multiplying each mesh value of the pattern density distribution U(x,y) by the corresponding mesh value of the dose distribution D(x,y).

In the fogging-electron-amount distribution F(x,y,U) calculating step (S106), the fogging-electron-amount distribution calculation unit 34 (fogging-charged-particle-amount distribution calculation unit) calculates a fogging-electron-amount distribution F(x,y,U) (fogging-charged-particle-amount distribution) (=E·g) by performing convolution of a fogging electron distribution function g(x,y) and the exposure intensity distribution E(x,y) calculated in the exposure intensity distribution E(x,y) calculating step described above. It will be specifically described below.

First, the distribution function g(x,y) indicating a spread distribution of a fogging electron can be defined by the following equation (4-1), using an influence radius $\sigma$ of the fogging effect. Here, Gaussian distribution is used as an example.

$$g(x,y)=(1/\pi\sigma^2)\times\exp\{-(x^2+y^2)/\sigma^2\} \quad (4-1)$$

The fogging-electron-amount distribution F (x,y,$\sigma$) can be defined by the following equation (4-2).

$$F(x,y,\sigma)=\iint g(x-x',y-y')E(x',y')dx'dy' \quad (4-2)$$

In the writing elapsed time T(x,y) calculating step (S107), the writing elapsed time calculation unit 37 calculates an elapsed time T(x,y) from the writing start time (starting time of writing a layout head or a head frame) to the time of actually writing each position on the target object 2. For example, when the frame region (stripe region) currently concerned is the i-th frame region, calculation is performed while treating, as an elapsed time T(x,y), an expected time from the writing start time to write a start position to the time of writing each position (x,y) up to the (i−1)th frame region (stripe region) which is just one frame before the i-th frame region.

In the accumulated time "t" calculating step (S108), the accumulated time calculation unit 38 calculates an accumulated time "t" by accumulating, for example, a writing time spent in writing a frame region (stripe region), serving as a writing unit region, having been written. For example, if the frame region currently concerned is the i-th frame region, an addition value is calculated by cumulatively adding the time t(1) for writing the first frame region, the time t(2) for writing the second frame region, and so on up to the time t(i) for writing the i-th frame region. Thereby, the accumulated time "t" up to the currently concerned frame region can be obtained.

Then, when actually writing the inside of the frame region currently concerned which is now being processed, since the writing has already been completed up to the frame region just before the one currently concerned, the portions irradiated by the electron beam 6 in the regions of up to the frame region just before the one currently concerned are charged portions. Therefore, a difference value (t−T) obtained by subtracting a writing elapsed time T(x,y) between starting writing and writing each position (x,y) in the regions, where the charged portions exist, up to the frame region just before the one currently concerned, from the writing accumulated time "t" between starting writing and writing the frame region currently concerned is the elapsed time after writing the charged portions.

In the charge-amount distribution C(x,y) calculating step (S109), the charge-amount distribution calculation unit 35 calculates a charge-amount distribution C(x,y), using the exposure intensity distribution E(x,y), the fogging-electron-amount distribution F(x,y,σ), the charge decay (attenuation) amount along with passage of time, and the charge amount contributed by the complexity of the pattern described above.

First, in a perimeter distance acquiring step being an internal step, the perimeter distance acquisition unit 39 acquires the perimeter distance W of the pattern per unit area from the storage devices 144. With respect to a plurality of figure patterns defined in the writing data stored in the storage device 140, the perimeter distance W of the pattern per unit area is calculated off-line for each predetermined unit area, and data of the perimeter distance W of the pattern per unit area is stored in the storage device 144. Alternatively, it is also preferable that the perimeter distance acquisition unit 39 reads writing data stored in the storage device 140, and calculates the perimeter distance W of the pattern per unit area for each predetermined unit area. When performing calculation in the writing apparatus 100, preferably, the calculation processing is performed in parallel with the pattern-area-density distribution U(x,y) calculating step (S100). Thereby, it is possible to avoid that calculation processing of the charge-amount distribution C(x,y) is made to wait due to the processing time for calculating the perimeter distance W of the pattern per unit area. Moreover, the mesh region used when calculating the pattern density U is preferably used as a unit area region for calculating the perimeter distance W of the pattern per unit area.

Here, the function C(E,F,T,t,U,W) for obtaining the charge-amount distribution C(x,y) is assumed as follows: Specifically, the function C(E,F,T,t,U,W) is resolved (separated) into the variable $C_E(E)$ contributed by an irradiation electron, the variable $C_F(F)$ contributed by a fogging electron, the charge decay component $C_T(T,t,U,W)$ contributed by an elapsed time, and the charge-amount component Cw(U,W) contributed by the complexity of the pattern described above. Moreover, as understood from that the charge decay component $C_T(T,t,U,W)$ depends on the pattern density U and the perimeter distance W of the pattern per unit area, components contributed by the complexity of the pattern described above should be taken into consideration. The function C(E,F,T,t,U,W) is defined by the following equation (5).

$$C(x, y) = C(E, F, T, t, U, W) \quad (5)$$
$$= C_E(E) + C_{Fe}(F) + C_F(F) + C_T(T, t, U, W) + C_W(U, W)$$
$$= (d_0 + d_1 \times U + d_2 \times D + d_3 \times (UD) + d_4 \times$$
$$(1 - \exp(d_5 \times (UD))) + d_6 \times (UD) \cdot \exp(d_7 \times (UD)) +$$
$$(e_1 \times F + e_2 \times F^2 + e_3 \times F^3) + (f_1 \times F + f_2 \times F^2 + f_3 \times F^3) +$$
$$\kappa(U) \cdot \exp\{-(t - T)/\lambda(U)\} + kw(U, W) \cdot \exp$$
$$\{-(t - T)/\lambda(U)\} + a(U) \cdot W/U + b(U)\{1 - \exp(-c \cdot W/U)\}$$
$$= d_0 + d_1 \times U + d_2 \times D + d_3 \times (UD) +$$
$$d_4 \times (1 - \exp(d_5 \times (UD))) + d_6 \times (UD) \cdot \exp(d_7 \times (UD)) +$$
$$(e_1 \times F + e_2 \times F^2 + e_3 \times F^3) + (f_1 \times F + f_2 \times F^2 + f_3 \times F^3) +$$
$$\kappa(U) \cdot \exp\{-(t - T)/\lambda(U)\} + \{kw1(U) \cdot W/U + kw2(U) \cdot$$
$$\{1 - \exp(-kw3 \cdot W/U)\}\} \cdot \exp\{-(t - T)/\lambda(U)\} +$$
$$a(U) \cdot W/U + b(U)\{1 - \exp(-c \cdot W/U)\}$$

As described above, according to the first embodiment, the charge-amount distribution calculation unit 35 calculates a charge-amount distribution C(x,y) of the irradiation region when the substrate 2 is irradiated with an electron beam, by using an index indicating complexity of the pattern. In other words, the charge-amount distribution C(x,y) is obtained by calculation using an area density U of a pattern, a perimeter distance W of the pattern per unit area, and a function depending on the area density U of the pattern. Thereby, approximation accuracy at the place (position) where positional deviation occurs due to pattern complexity can be increased.

The charge decay amount κ(U) depending on the pattern area density U used for the equation (5) can be approximated by the following equation (6), for example. Although here the equation (6) is a quadratic function, it is not limited thereto. A higher order function than the quadratic function, or a low order function than that may also be used.

$$\kappa(U) = \kappa_0 + \kappa_1 U + \kappa_2 U^2 \quad (6)$$

Then, the charge decay time constant A (U) depending on the pattern area density U used for the equation (5) can be approximated by the following equation (7), for example. Although here the equation (7) is a quadratic function, it is not limited thereto. A higher order function than the quadratic function, or a low order function than that may also be used.

$$\lambda(U) = \lambda_0 + \lambda_1 U + \lambda_2 U^2 \quad (7)$$

The coefficients $d_0$, $d_1$, $d_2$, $d_3$, $d_4$, $d_5$, $d_6$, $d_7$, $e_1$, $e_2$, $e_3$, $f_1$, $f_2$, $f_3$, $\kappa_0$, $\kappa_1$, $\kappa_2$, $\lambda_0$, $\lambda_1$, $\lambda_2$, kw3, and c, and functions kw1(U), kw2(U), a(U), and b(U) of the equations (5) to (7) may be acquired by fitting (approximating) an experimental result and/or simulation result, similarly to Japanese Patent Publications (JP-A) No. 2012-15246, and No. 2015-138882 described above.

According to the first embodiment, correction is performed by further adding the charge-amount component Cw(U,W) contributed by the complexity of the pattern described above to the variable $C_F(E)$ contributed by a conventional irradiation electron, the variable $C_F(F)$ contributed by a fogging electron, and the charge decay component $C_T(T,t)$ contributed by an elapsed time. Moreover, the correction is performed by adding a component contributed by the complexity of the pattern described above to the charge decay component $C_T(T,t)$. Therefore, the variable $C_E(E)$ contributed by a conventional irradiation electron, the variable $C_F(F)$ contributed by a fogging electron, and the charge decay component $C_T(T,t)$ contributed by an elapsed time can be obtained in a manner similar to the conventional one. For example, it can be obtained as follows:

First, using the charge decay amount κ, the charge decay time constant λ, and the writing elapsed time t, the decay curve of the charge amount C of each pattern area density U can be approximated by the following equation (8) expressed by an exponential function.

$$C = \kappa \cdot \exp(-t/\lambda) \tag{8}$$

With respect to the pattern area densities U (pattern area rates U) of 25%, 50%, 75%, and 100%, by fitting the difference between the measurement position immediately after writing a predetermined charging pattern and the measurement position fifty minutes after writing, the charge decay amount κ(U) depending on the pattern area density U approximated by the equation (5) can be obtained. As described above, a simple pattern can be used as the charging pattern.

With respect to the pattern area densities U (pattern area rates U) of 25%, 50%, 75%, and 100%, by fitting each difference between the measurement position at plural timings during from the time immediately after writing a predetermined charging pattern to the time fifty minutes have passed since the writing, and the measurement position fifty minutes after writing, the charge decay time constant λ(U) depending on the pattern area density U approximated by the equation (7) can be obtained.

Based on the above results, the charge amount C(x,y) at each position (coordinates (x,y)) in the irradiated part in which a predetermined charging pattern has been written can be approximated by the following equation (9).

$$C(x,y) = \kappa(U) \cdot \exp(-t/\lambda(U)) \tag{9}$$

As described above, since the difference value (t−T) is the elapsed time after writing the charged part, $C_T(T,t)$ using the equation (9) can be transformed to the following equation (10).

$$C_T(T,t) = \kappa(U) \cdot \exp\{-(t-T)/\lambda(U)\} \tag{10}$$

In the equation (10), estimation is performed under the assumption that the charge decay amount κ(U) is uniform at all the positions in the evaluation pattern 20 for charging. Although the size of negative charge decay κ(U) increases as the pattern area density U increases from 25% to 75%, the negative charge decay κ(U) starts decreasing at the pattern area density U of 100%. Actually, when writing a charging pattern of a predetermined size extending over a plurality of frame regions, a considerable time has passed between the portion written first and the portion written last. When a positional deviation amount Y" is calculated using a charge decay amount κ"(U) after correction, which is obtained by applying the charge decay time constant X for decaying the charge to the charge decay amount κ(U) obtained using a measured positional deviation amount Y under the assumption of uniform distribution, the positional deviation amount Y" is smaller than Y. Then, the charge decay amount κ(U) may be corrected using a correction equation κ"=L(λ)·κ that makes the positional deviation amount Y" be equal to the original positional deviation amount Y.

For example, by performing fitting of the result of plotting κ"/κ at each charge decay time constant λ, using a plurality of charge decay time constants λ, a correction equation κ"=L(λ)·κ can be obtained. For example, κ"=(1+3.1082·Δ$^{-1.0312}$)·κ can be obtained.

For example, although there is a case where the charge decay amounts at the pattern area densities of 75% and 100% are inverted, such an inversion phenomenon is removed by applying correction of L(λ), and the charge decay amount κ"(U) after the correction becomes smaller in accordance with the pattern area densities of 25%, 50%, 75%, and 100% in order.

In the model according to the first embodiment, first, with disregarding the charge decay component $C_T(T,t)$, the function for the irradiation region is assumed to be a variable $C_F(F)=0$, namely $C(E,F,T,t)=C_E(E)$. On the other hand, the function for the non-irradiation region is assumed to be a variable $C_E(E)=0$, namely $C(E,F)=C_F(F)$. The inside the irradiation region is assumed to be uniformly charged, namely $C_E(E)=c_o$. This $c_o$ is a constant, for example, 1.

First, the relation between the charge-amount distribution $C_F(F)$ of the non-irradiation region and the fogging electron amount intensity F is represented by a polynomial function such as the following equation (11). In the equation (11), $f_1$, $f_2$, and $f_3$ are constants.

$$C_F(F) = f_1 \times F + f_2 \times F^2 + f_3 \times F^3 \tag{11}$$

Next, with respect to each pattern density, the charge-amount distribution C(x,0) at y=0 is calculated. The accuracy of fitting performed below can be increased by calculating, without limiting to y=0, the charge-amount distribution C(x,y) in two dimensions.

Then, the optimal fogging radius σ is calculated such that the charge-amount distribution C(x,0) of the non-irradiation region and $C_F(F)$ of the equation (11) fit each other best. If the fogging radius σ is too small, or if the fogging radius σ is too large, a proper fitting result cannot be obtained. That is, since data of each pattern density separates from each other when the fogging radius σ is too small or too large, it is impossible to calculate the parameters $f_1$, $f_2$, and $f_3$. On the other hand, when the optimal fogging radius σ is obtained, a proper fitting result can be obtained, so that it is possible to calculate the parameters $f_1$, $f_2$, and $f_3$.

Next, using the calculated optimal fogging radius σ, a fogging-electron-amount distribution F of the irradiation region is obtained. The charge-amount distribution C(E,F) of the irradiation region is represented by a polynomial function, such as the following equation (12), using the exposure intensity distribution E and the fogging-electron-amount distribution F. The charge-amount distribution $C_{Fe}(F)$ to which the fogging electron contributes is taken into consideration in the equation (12).

$$C(E, F) = C_E(E) + C_{Fe}(F) = \tag{12}$$
$$(d_0 + d_1 \times U + d_2 \times D + d_3 \times E) + d_4 \times (1 - \exp(d_5 \times E)) +$$
$$d_6 \times E \cdot \exp(d_7 \times E) + (e_1 \times F + e_2 \times F^2 + e_3 \times F^3)$$

Parameters $d_0$, $d_1$, $d_2$, $d_3$, $d_4$, $d_5$, $d_6$, $d_7$, $e_1$, $e_2$, and $e_3$ are calculated such that the charge-amount distribution C(x,0) of the irradiation region and the charge-amount distribution C(E,F) of the equation (12) fit each other best.

Next, using a charge-amount distribution C(x,y) obtained by adding a charge amount distribution due to charge decay to the charge-amount distribution C(E, F) of the irradiation region represented in the equation (12), evaluation is performed depending on the pattern complexity described above. Then, fitting an obtained measurement result, the parameter of the charge amount component Cw(U,W) contributed by the pattern complexity is calculated. Moreover, also with respect to a charge decay component, evaluation is performed depending on the pattern complexity described above. Then, the parameter of the charge decay intensity kw(U,W) contributed by pattern complexity is calculated by fitting deviation between the cases of considering and not considering pattern complexity. The equation (5) described above can be obtained by further adding the calculated charge amount component Cw(U,W) and a component which is obtained by multiplying the charge decay intensity kw(U,W) by $\exp\{-(t-T)/X(U)\}$, to the charge-amount distribution C(x,y) acquired by adding a charge amount distribution due to charge decay to the charge-amount distribution C(E, F) of the irradiation region. Thereby, the charge decay component can be corrected.

These coefficients, functions, and the response function r(x,y) described later are stored in the storage device 143 in advance.

In the positional-deviation-amount distribution p(x,y) calculating step (S110), the positional-deviation-amount distribution calculation unit 36 (positional deviation amount calculation unit) calculates, using the acquired charge-amount distribution C(x,y), a positional deviation amount of an irradiation pattern formed by irradiation with the electron beam 6. Specifically, the positional-deviation-amount distribution calculation unit 36 calculates a positional deviation amount P of the writing position (x,y) due to the charge amount of each position (x,y) in the charge-amount distribution C(x,y) by performing convolution of a response function r(x,y) with each charge amount C of the charge-amount distribution C(x,y). A response function r(x,y) is assumed which converts the charge-amount distribution C(x,y) into the positional-deviation-amount distribution P(x, y). Here, a charging position indicated by each position in the charge-amount distribution C(x,y) is expressed by (x',y'), and a beam irradiation position in a frame region concerned (e.g., the i-th frame region) which is being processed is expressed by (x,y). Since here the beam positional deviation can be represented as a function of the distance from a beam irradiation position (x,y) to a charging position (x',y'), it is possible to express the response function as r(x-x',y-y'). The response function r(x-x',y-y') may be obtained in advance from an experiment such that it fits the experiment result. In the following description in the first embodiment, (x,y) indicates the beam irradiation position of the frame region being data processed.

Then, the positional-deviation-amount distribution calculation unit 36 generates a positional deviation amount distribution Pi(x,y) (or called a positional deviation amount map Pi(x,y)) based on the positional deviation amount P of each position (x,y) to be written in the i-th frame region concerned. The calculated positional deviation amount map Pi(x,y) is output to the control computer 120 in addition to being stored in the storage device 143, for example.

On the other hand, in the control computer 120, the shot data generation unit 41 reads writing data from the storage device 140, and performs data conversion processing of several steps in order to generate shot data in a format specific to the writing apparatus 100. The size of a figure pattern defined in the writing data is usually larger than the shot size which can be formed by one shot by the writing apparatus 100. Therefore, each figure pattern is divided into a plurality of shot figures (shot division) each having a size that can be formed by one shot of the writing apparatus 100. Then, for each shot figure, data such as a figure code indicating the figure type, coordinates, and size (dimensions) are defined as shot data.

In the deflection position correcting step (S112) (positional deviation correcting step), the positional deviation correction unit 42 (correcting unit) corrects the irradiation position, using the amount of positional deviation. Here, shot data at each position is corrected. Specifically, a correction value for correcting a positional deviation amount shown in the positional deviation amount map Pi(x,y) is added to each position (x,y) of the shot data. For example, it is preferable to use, as the correction value, a value obtained by reversing the positive and negative signs of the positional deviation amount shown in the positional deviation amount map Pi(x,y). Thereby, since the coordinates of the irradiation target are corrected when irradiated with the electron beam 6, the deflection position deflected by the objective deflector 13 is corrected. The shot data is defined in the order of shots in the data file.

In the writing step (S114), in the deflection control circuit 130, the shaping deflector control unit 43 calculates, for each shot figure, in the order of shots, a deflection amount of the shaping deflector 10 for variably shaping the electron beam 6, based on the figure type and size (dimensions) defined in the shot data. At the same time, the objective deflector control unit 44 calculates a deflection amount of the deflector 13 for deflecting the shot figure concerned to the position to be irradiated on the target object 2. In other words, the objective deflector control unit 44 (deflection amount calculation unit) calculates a deflection amount for deflecting an electron beam to the corrected irradiation position. The electron optical column 1 emits an electron beam to the corrected irradiation position. Specifically, the deflector 13 disposed in the electron optical column 1 deflects an electron beam based on the calculated deflection amount in order to irradiate the corrected irradiation position by the electron beam. Thereby, the writing mechanism 150 writes a pattern at the charge-corrected position on the target object 2.

Figure 10:
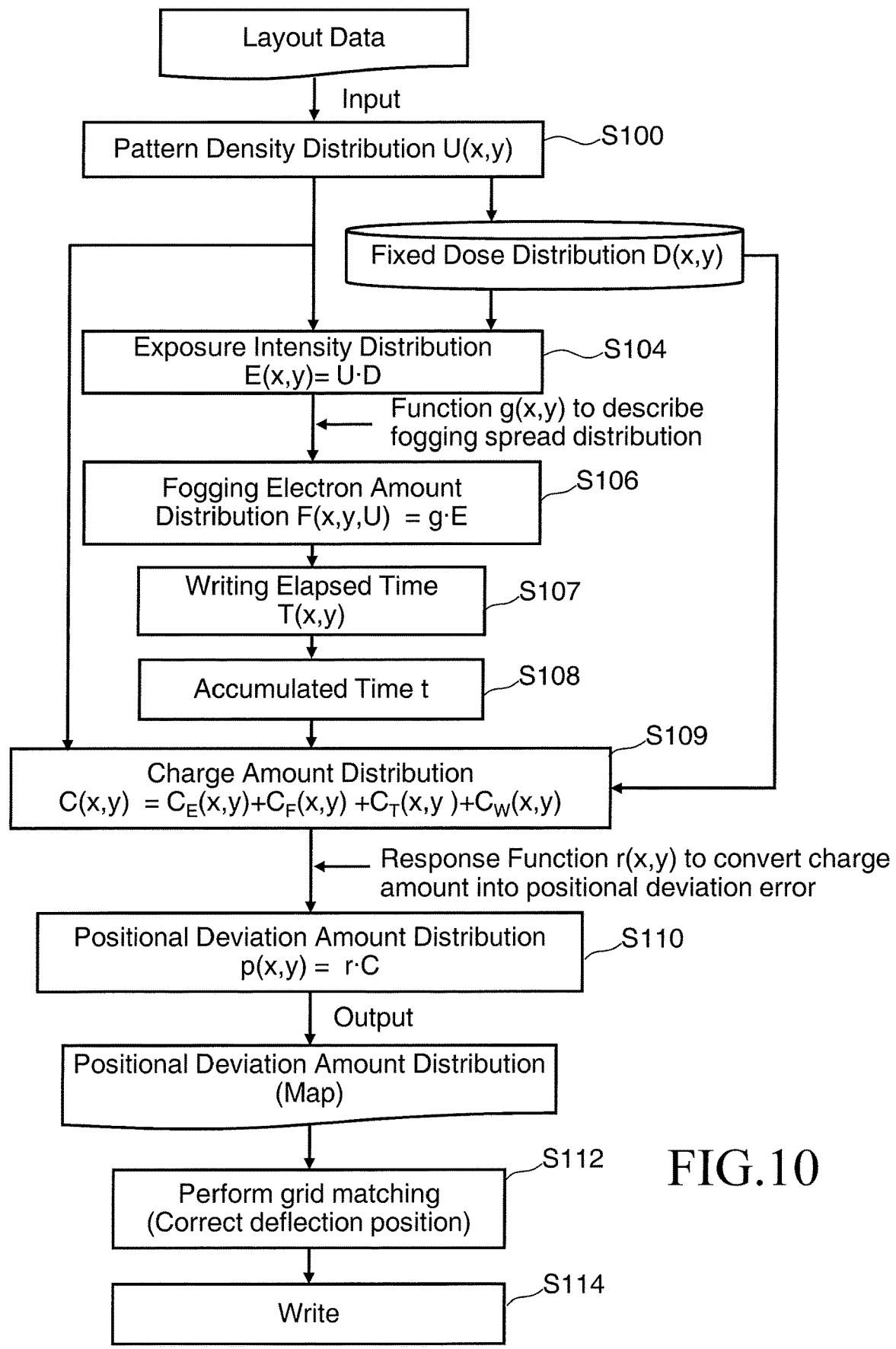
FIG. 10 is a flowchart showing another example of main steps of a writing method according to the first embodiment.

FIG. 10 is a flowchart showing another example of main steps of a writing method according to the first embodiment. The contents of FIG. 10 are the same as those of FIG. 9 except that a fixed dose distribution D(x,y) is used, regardless of the pattern density distribution U(x,y), instead of the dose distribution D(x,y) calculating step (S102) of FIG. 9.

Figure 11:
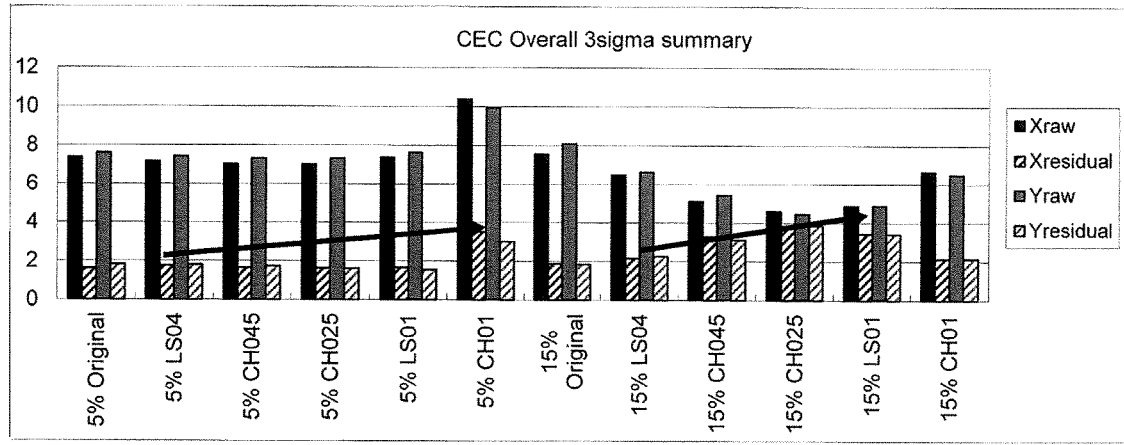
FIG. 11 shows an example of a positional deviation amount as a result of performing a charging effect correction according to a comparative example of the first embodiment.
Figure 12:
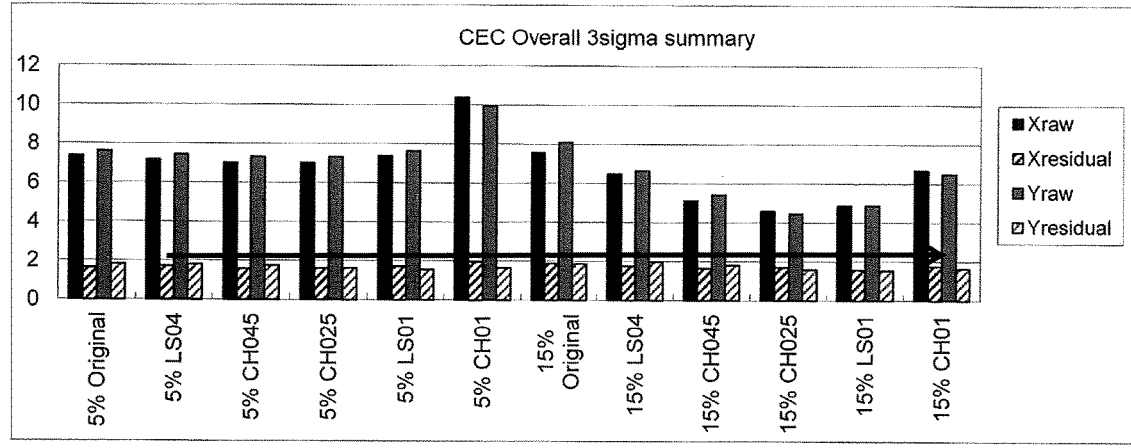
FIG. 12 shows an example of a positional deviation amount as a result of performing a charging effect correction according to the first embodiment.
Figure 13:
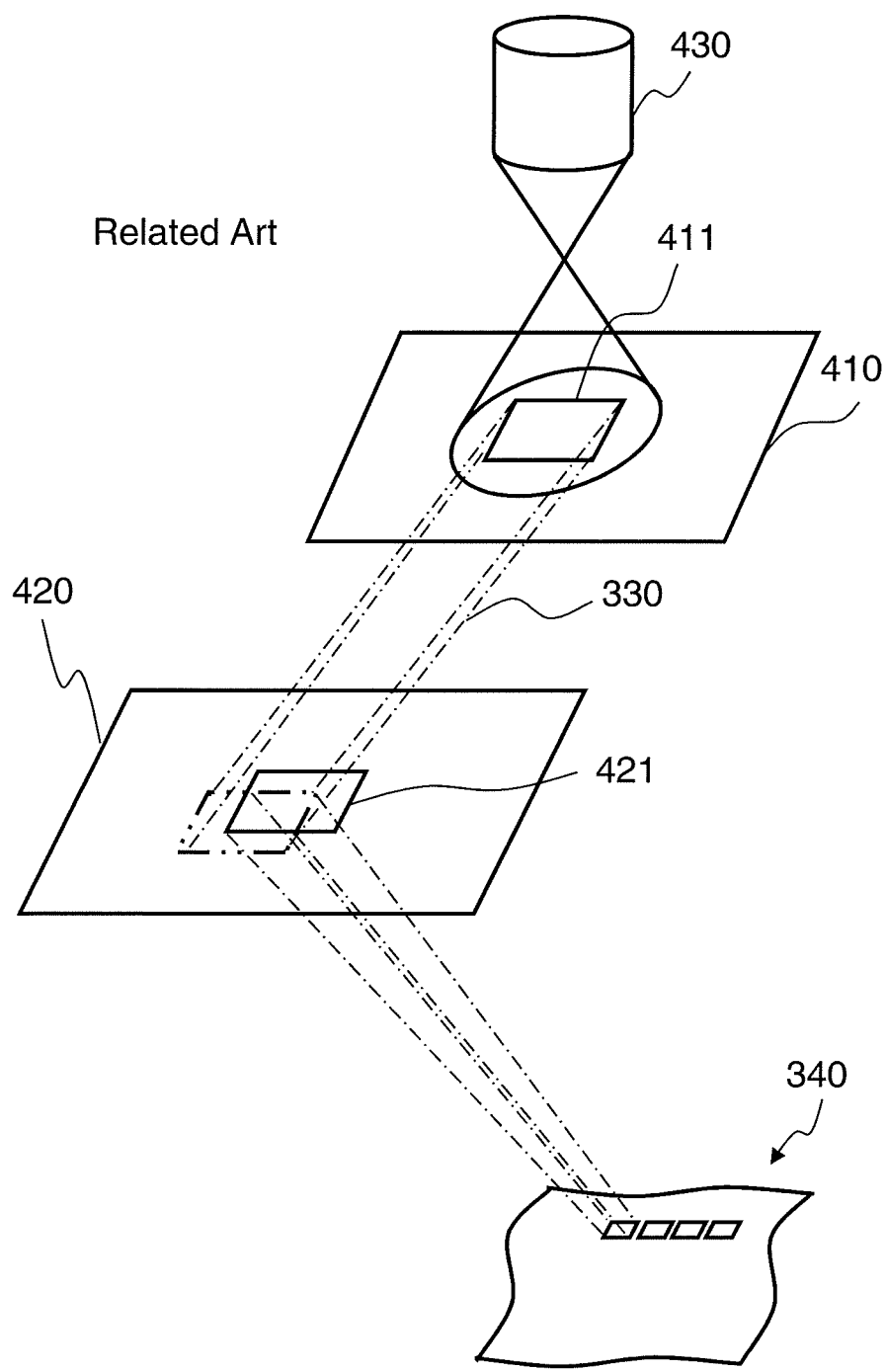
FIG. 13 is a conceptual diagram explaining operations of a variable-shaped electron beam writing apparatus.

FIG. 11 shows an example of a positional deviation amount as a result of performing a charging effect correction according to a comparative example of the first embodiment. FIG. 12 shows an example of a positional deviation amount as a result of performing a charging effect correction according to the first embodiment.

In FIG. 11, the comparative example shows a result of calculation of the charge-amount distribution C(x,y), where the charge amount component Cw(U,W) contributed by the pattern complexity described above is not taken into consideration. Moreover, simultaneously, the comparative example shows a result of the charge decay component $C_T(T,t)$, where the component contributed by the pattern complexity described above is not taken into consideration. The example of FIG. 11 shows measurement results of pattern densities U of 5% and 15% in the evaluation patterns shown in FIG. 6. As shown in FIG. 11, it turns out that as the perimeter distance W per unit area becomes larger, the positional deviation amount (Xresidual) in the x direction and the positional deviation amount (Yresidual) in the y direction become larger. On the other hand, like the case of charging effect correction according to the first embodiment, when considering the charge amount component Cw(U,W) contributed by the pattern complexity described above, and simultaneously considering the component contributed by the pattern complexity described above into the charge decay component $C_T(T,t)$, as a result as shown in FIG. 12, the positional deviation amount (Xresidual) in the x direction and the positional deviation amount (Yresidual) in the y direction can be corrected at almost the same level regardless of the perimeter distance W per unit area. Therefore, it is possible to eliminate or reduce the dependency of the correction accuracies on pattern complexity.

As described above, according to the first embodiment, the accuracy of charging effect correction can be improved as compared to the conventional one. Thus, it is possible to apply a beam to the highly accurate irradiation position.

Embodiments have been explained referring to specific examples described above. However, the present invention is not limited to these specific examples. Positional deviation of the irradiation position due to a charging phenomenon is not limited to the electron beam writing apparatus. The present invention can be applied to an electron beam apparatus which uses a result obtained by applying an electron beam to an aimed position, such as an inspection apparatus for inspecting a pattern with electron beams.

While the apparatus configuration, control method, and the like not directly necessary for explaining the present invention are not described, some or all of them may be suitably selected and used when needed. For example, although description of the configuration of a control system for controlling the writing apparatus 100 is omitted, it should be understood that some or all of the configuration of the control system is to be selected and used appropriately when necessary. For example, the control computers 110 and 120 of FIG. 1 may be connected, through a bus (not shown), to a storage device, such as an RAM (Random Access Memory), a ROM, and a magnetic disk (HD) drive, to an input unit, such as a keyboard (K/B) and a mouse, to an output unit, such as a monitor and a printer, or to an input/output unit, such as FD, DVD, CD, etc.

In addition, any other electron beam irradiation method and electron beam irradiation apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam irradiation method comprising:
   calculating a charge amount distribution in a case where a substrate is irradiated with an electron beam, by using an index indicating complexity of a shape boundary of a pattern to be formed on the substrate, wherein an area density U of a pattern and a perimeter distance W of a pattern per unit area are used as the index indicating complexity of the shape boundary of the pattern;
   calculating a positional deviation amount of an irradiation pattern to be formed due to irradiation with the electron beam, by using the charge amount distribution having been calculated;
   correcting an irradiation position by using the positional deviation amount having been calculated; and
   applying an electron beam to the irradiation position having been corrected.

2. The method according to claim 1, wherein the charge amount distribution is calculated using a function depending on the area density U of the pattern.

3. The method according to claim 1, wherein the charge amount distribution is calculated by a model equation of $a(U) \cdot W/U + b(U)\{1-\exp(-c \cdot W/U)\}$ which uses the area density U of the pattern, the perimeter distance W of the pattern per unit area, a function $a(U)$ depending on the area density U of the pattern, a function $b(U)$ depending on the area density U, where the function $b(U)$ is different from the function $a(U)$, and a coefficient c.

4. The method according to claim 1, wherein the charge amount distribution is calculated using, in addition to the index indicating complexity, an exposure intensity distribution, a fogging electron amount distribution, and a charge decay amount along with passage of time.

5. An electron beam irradiation apparatus comprising:
   a charge amount distribution calculation circuit programmed to calculate a charge amount distribution in a case where a substrate is irradiated with an electron beam, by using an index indicating complexity of a shape boundary of a pattern to be formed on the substrate, wherein an area density U of a pattern and a perimeter distance W of a pattern per unit area are used as the index indicating complexity of the shape boundary of the pattern;
   a positional deviation amount calculation circuit programmed to calculate a positional deviation amount of an irradiation pattern to be formed due to irradiation by the electron beam, by using the charge amount distribution having been calculated;
   a correction circuit programmed to correct an irradiation position by using the positional deviation amount having been calculated; and
   an electron beam irradiation mechanism including an emission source which emits the electron beam and a deflector which deflects the electron beam to apply an electron beam to the irradiation position having been corrected.

6. The apparatus according to claim 5, wherein the charge amount distribution calculation circuitry calculates the charge amount distribution by using a function depending on the area density U of the pattern.

7. The apparatus according to claim 5, wherein the charge amount distribution calculation circuitry calculates the charge amount distribution by a model equation of $a(U) \cdot W/U + b(U)\{1-\exp(-c \cdot W/U)\}$ which uses the area density U of the pattern, the perimeter distance W of the pattern per unit area, a function $a(U)$ depending on the area density U of the pattern, a function $b(U)$ depending on the area density U, where the function $b(U)$ is different from the function $a(U)$, and a coefficient c.

8. A non-transitory computer readable storage medium storing a program for causing a computer, which controls an electron beam irradiation apparatus for applying an electron beam, to execute processing comprising:
   calculating a charge amount distribution in a case where a substrate is irradiated with an electron beam, by using an index, which indicates complexity of a shape boundary of a pattern to be formed on the substrate, read from a storage device, wherein an area density U of a pattern and a perimeter distance W of a pattern per unit area are used as the index indicating complexity of the shape boundary of the pattern; and calculating a positional deviation amount of an irradiation pattern to be formed due to irradiation by the electron beam, by using the charge amount distribution having been calculated.

9. The method according to claim 1, wherein the charge amount distribution is calculated using WV obtained by dividing the perimeter distance W by the area density U.

10. The apparatus according to claim 5, wherein the charge amount distribution is calculated using W/U obtained by dividing the perimeter distance W by the area density U.

* * * * *